United States Patent
Rub et al.

(10) Patent No.: US 9,015,549 B2
(45) Date of Patent: Apr. 21, 2015

(54) ITERATING INNER AND OUTER CODES FOR DATA RECOVERY

(75) Inventors: Bernardo Rub, Sudbury, MA (US); Ara Patapoutian, Hopkinton, MA (US); Arvind Sridharan, Longmont, CO (US); Bruce D. Buch, Westborough, MA (US)

(73) Assignee: Seagate Technology LLC, Cupertino, CA (US)

( * ) Notice: Subject to any disclaimer, the term of this patent is extended or adjusted under 35 U.S.C. 154(b) by 146 days.

(21) Appl. No.: 13/094,048

(22) Filed: Apr. 26, 2011

(65) Prior Publication Data

US 2012/0278679 A1    Nov. 1, 2012

(51) Int. Cl.
| | |
|---|---|
| *H03M 13/00* | (2006.01) |
| *G11B 20/18* | (2006.01) |
| *H03M 13/29* | (2006.01) |
| *H03M 13/37* | (2006.01) |
| *H03M 13/11* | (2006.01) |
| *H03M 13/15* | (2006.01) |

(52) U.S. Cl.
CPC .... *G11B 20/1833* (2013.01); *G11B 2020/1836* (2013.01); *G11B 2020/1853* (2013.01); *G11B 2220/2516* (2013.01); *H03M 13/1102* (2013.01); *H03M 13/1515* (2013.01); *H03M 13/2909* (2013.01); *H03M 13/2927* (2013.01); *H03M 13/3746* (2013.01)

(58) Field of Classification Search
None
See application file for complete search history.

(56) References Cited

U.S. PATENT DOCUMENTS

| | | | |
|---|---|---|---|
| 5,517,484 A | 5/1996 | Takagi et al. | |
| 5,844,919 A | 12/1998 | Glover et al. | |
| 5,991,911 A * | 11/1999 | Zook | 714/758 |
| 6,772,384 B1 * | 8/2004 | Noguchi | 714/755 |
| 6,903,887 B2 | 6/2005 | Asano et al. | |
| 6,981,197 B2 | 12/2005 | Liu et al. | |
| 6,989,776 B2 | 1/2006 | Tsang | |
| 7,000,168 B2 | 2/2006 | Kurtas et al. | |
| 7,038,993 B2 | 5/2006 | Minamino et al. | |
| 7,080,306 B1 | 7/2006 | Sugawara et al. | |
| 7,263,650 B2 | 8/2007 | Keeler et al. | |
| 7,356,753 B2 * | 4/2008 | Chen | 714/755 |
| 7,415,651 B2 | 8/2008 | Argon | |

(Continued)

OTHER PUBLICATIONS

Greaves, S.; Kanai, Y.; Muraoka, H.; , "Shingled Magnetic Recording on Bit Patterned Media," Magnetics, IEEE Transactions on, vol. 46, No. 6, pp. 1460-1463, Jun. 2010.*

(Continued)

*Primary Examiner* — Steve Nguyen
(74) *Attorney, Agent, or Firm* — Cesari & Reed LLP; Kirk A. Cesari; David K. Lucente

(57) ABSTRACT

A storage medium includes at least one data unit defining a plurality of symbol-based inner code words and a plurality of symbol-based outer code words. Each symbol included in one of the inner code words is also included in one of the outer code words. A processor is configured to perform a first iteration of inner code error correction on the plurality of symbol-based inner code words, a first iteration of outer code error correction on the plurality of symbol-based outer code words and a second iteration of inner code error correction on the plurality of symbol-based inner code words. In the first iteration of outer code error corrections, at least one of the outer code words is correctable. In the second iteration of inner code error correction, at least one of the inner code words is correctable.

20 Claims, 7 Drawing Sheets

(56) References Cited

U.S. PATENT DOCUMENTS

| | | |
|---|---|---|
| 7,536,625 B2 | 5/2009 | Seng et al. |
| 7,724,853 B2 * | 5/2010 | Jin et al. .......................... 375/347 |
| 8,230,296 B2 * | 7/2012 | Belogolovy et al. .......... 714/755 |
| 2007/0150798 A1 * | 6/2007 | Shieh et al. ................... 714/785 |
| 2010/0146372 A1 * | 6/2010 | Tomlinson et al. ........... 714/780 |
| 2010/0253555 A1 * | 10/2010 | Weingarten et al. ............ 341/51 |

OTHER PUBLICATIONS

U.S. Appl. No. 12/790,120, filed May 28, 2010 entitled "Outer Code Protection for Solid State Memory Devices".

* cited by examiner

ITERATING INNER AND OUTER CODES FOR DATA RECOVERY

SUMMARY

A method and apparatus recovers data from a storage medium. The storage medium includes at least one data unit having a plurality of segments for storing data. The plurality of segments include k number of segments and r number of segments. Each k segment includes user data and inner code parity for providing inner code protection against errors within the segment and each r segment includes outer code parity and inner code parity for providing outer code protection against inner code failures.

In the storage medium, the r number of parity segments are associated with the k number of data segments to derive a plurality of symbol-based outer code words. Each outer code word contains m number of symbols from each segment for correcting m number of symbols in each outer code word.

A processor is configured to carry out data recovery from the storage medium by iteratively performing error correction by alternating between using the inner code parity to correct errors within the segment and using the outer code parity to correct errors in the outer code words. In particular, the processor performs a first iteration of inner code error correction on a plurality of symbol-based inner code words, a first iteration of outer code error correction on a plurality of symbol-based outer code words and performs a second iteration of inner code error correction on the plurality of symbol-based inner code words. When performing the first iteration of outer code error correction, at least one of the outer code words is correctable. When performing the second iteration of inner code error correction, at least one of the inner code words is correctable.

These and other features and benefits that characterize various embodiments of the disclosure can be understood in view of and upon reading the following detailed description and review of the associated drawings.

DETAILED DESCRIPTION

Figure 1:
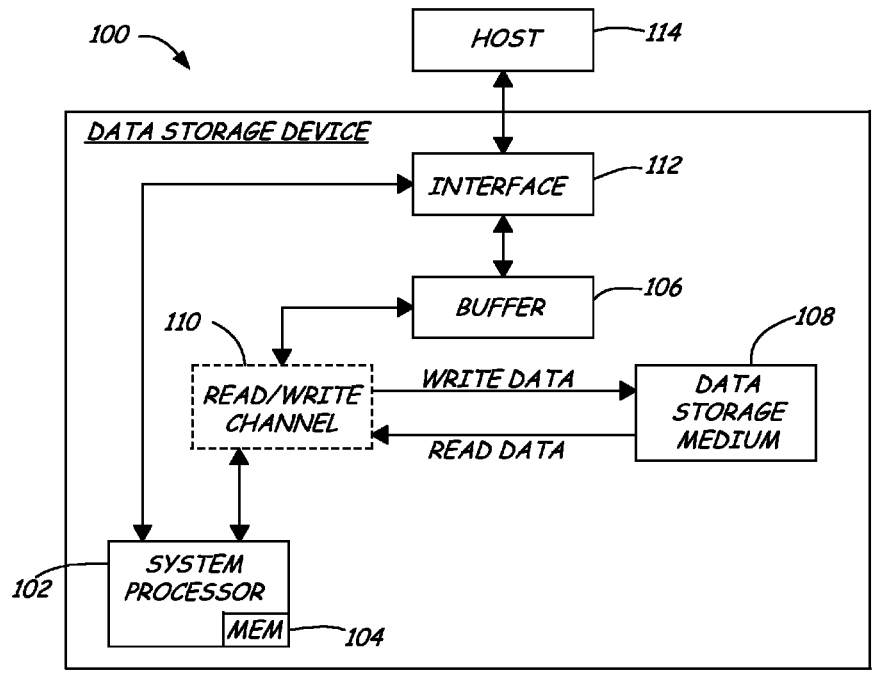
FIG. 1 is a simplified block diagram of an exemplary data storage device that can be used with embodiments described herein.

Embodiments of the disclosure provide a method and apparatus for recovering data on a storage medium. More specifically, the disclosure provides a method and apparatus for iteratively using inner and outer codes to recover data. For example, on a shingled magnetic recording (SMR) medium, data units, such as data tracks, partially overlap like shingles on a roof. In this type of format, physical writes tend to be sequential, and as a result, can accommodate longer code words (or outer codes) than code words in other types of recording. Such an exemplary type of data storage provides an embodiment where using inner and outer codes to correct errors is possible.

A code includes rules for converting a piece of information into another representation (i.e., one symbol into another symbol). A code word is an element of a code. Each code word includes a sequence of assembled symbols that correspond with the rules of the code. For example, codes can be used in the error-correction of data. These types of codes, often described as channel codes, contain redundancy to provide for the communication of more reliable data in the presence of noise. One example error-correcting code is a concatenated code. Concatenated codes are derived by using an inner code and an outer code.

Outer codes improve the tolerance to defects, by allowing one or more inner code failures. The size of a defect that can be corrected is closely related to the code overhead (i.e., the outer code). Therefore, an outer code or longer code word can achieve the desired defect coverage with less relative overhead. Having an outer code that can recover inner code failures also allows the inner code to be optimized for random error performance. LDPC (low density parity check) codes (which are generally included in an inner code) trade off performance to lower the error floor below the unrecoverable error rate. With an outer code as a safety mechanism, the error floor can be relaxed and LDPC codes can be optimized for performance.

Outer codes can be implemented by x-or'ing data across all inner code words. Such an implementation provides the capability to recover from a single inner code word failure. The main drawback of this implementation is that the signal-to-noise (SNR) gain for the overhead expended is relatively small. In another implementation, outer codes can be derived based on Reed-Solomon codes. Such codes allow for multiple inner code failures and offer a significant SNR benefit for random errors. Furthermore, outer codes can "average out" the SNR variability. In sequential writing, such as in SMR, many sources of variability are removed. For example, degraded signals due to adjacent track interference (ATI) or adjacent track erasure (ATE) are greatly diminished because repeated writes to adjacent or neighboring tracks are eliminated. However, variability in regards to SNR, primarily due to transducer positioning, can occur. Yet, outer codes (or very long code words) can exceed the time constants of the SNR variability and offer the "averaged out" SNR variability.

FIG. 1 is a simplified block diagram of an exemplary data storage device 100 that can be used in embodiments described herein. Data storage device 100 includes a system processor 102, which is used for controlling certain operations of data storage device 100. The various operations of data storage device 100 are controlled by system processor 102 with the use of programming stored in memory 104. System processor 102 may be coupled to a buffer 106 through an optional read/write channel 110. Buffer 106 can temporarily store user data during read and write operations and may include the capability of temporarily storing access operations pending execution by system processor 102.

System processor 102 executes read and write operations on data storage medium 108. In one embodiment, system processor 102 is also used for carrying out data recovery from data storage medium 108. In some embodiments, data storage medium 108 is one or more magnetic discs. In other embodiments, data storage medium 108 can be a collection of solid-state memory elements. These read/write operations executed by system processor 102 may be performed directly on data storage medium 108 or through optional read/write channel 110. Read/write channel 110 receives data from system processor 102 during a write operation, and provides encoded write data to data storage medium 108. During a read operation, read/write channel 110 processes a read signal in order to detect and decode data recorded on data storage medium. The decoded data is provided to system processor 102 and ultimately through an interface 112 to an external host 114.

External host 114 is a processor in an electronic device, such as a processor in a computing device. Although FIG. 1 illustrates external host 114 as being a single host, data storage device 100 can be connected through interface 112 to multiple hosts. Through interface 112, data storage device 100 receives data and commands from external host 114 and can provide data and error codes to external host 114 based on commands executed by system processor 102.

Data storage medium 108 includes a plurality of data units. Each data unit is subdivided into a plurality of storage segments. As defined herein, a storage segment is the basic unit of data storage on data storage medium 108. Each storage segment is identified and located at various positions on medium 116.

Figure 2:
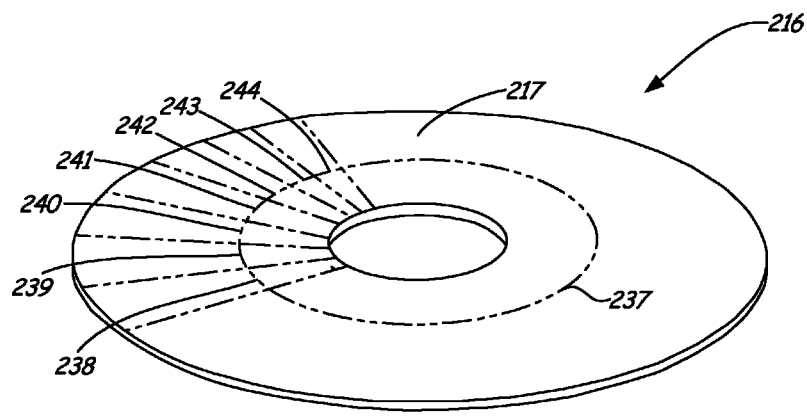
FIG. 2 illustrates an exemplary perspective view of a storage medium that can be used with embodiment described herein.

As previously discussed, data storage medium 108 can include one or more magnetic discs. FIG. 2 illustrates such an exemplary disc storage medium 216. In FIG. 2, storage medium 216 includes a surface 217 having a plurality of substantially concentric circular tracks (i.e., data units), such as data track 237. In some embodiments, the data tracks on storage medium 216 are logically divided into a plurality of data storage sectors (i.e., storage segments). Each storage sector is identified and located at various positions on disc 216. In the disc-type medium example illustrated in FIG. 2, storage segments or data sectors are "pie-shaped" angular sections of a track that are bounded on two sides by radii of the disc and on the other side by the perimeter of the circle that defines the track. For example, data track 237 is logically divided into data sectors 238-244.

Each track or data unit has related logical block addressing (LBA). For disc-type storage media, the LBA includes a cylinder address, head address and sector address. A cylinder identifies a set of specific tracks on the disc surface to each disc 116 which lie at equal radii and are generally simultaneously accessible by a collection of transducing heads in a data storage device. The head address identifies which head can read the data and therefore identifies which disc from the plurality of discs 216 the data is located. As mentioned above, each track within a cylinder is further divided into sectors for storing data. The data sector is identified by an associated sector address.

With reference back to FIG. 1 and under embodiments described in more detail below, system processor 102 implements a two-level parity encoding system to detect and correct data errors. These embodiments organize data into two sets of groupings with the first set of grouping being encoded by an inner code and the second set of grouping being encoded by an outer code.

Figure 3:
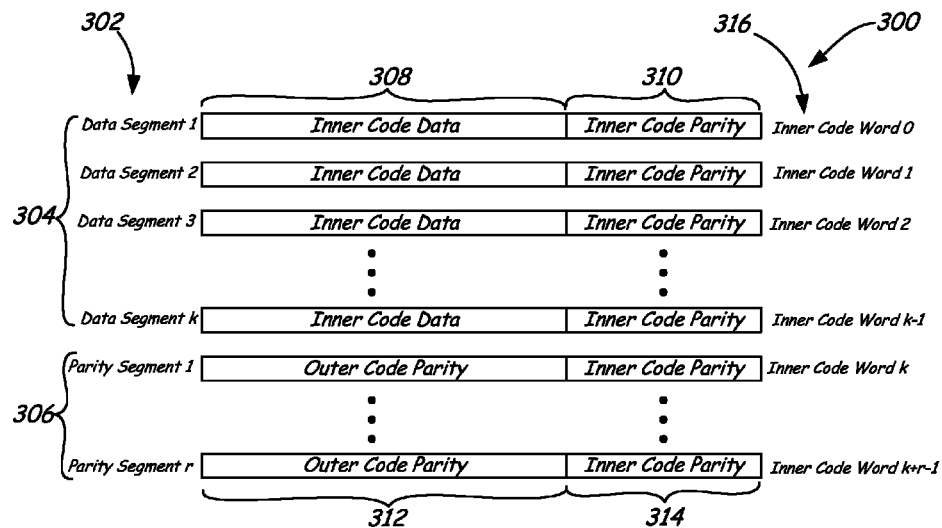
FIG. 3 illustrates a diagrammatic view of one embodiment of a data unit and its organized groupings of data into inner and outer codes.

FIG. 3 illustrates a diagrammatic view of one embodiment of a data unit 300 and its organized groupings of data into inner and outer codes. Data unit 300 includes a plurality of segments 302 for storing user data and/or parity data. Not only does each row in FIG. 3 represent a segment 302 in data unit 300, but each row in FIG. 3 also represents one grouping in the first set of groupings being encoded by an inner code.

Segments 302 are further divided into k number of segments 304 and r number of segments 306, wherein k and r are integers greater than or equal to 1. Each of the k number of segments 304 includes a first portion 308, which contains user data encoded by the inner code. Each of the k number of segments 304 also includes a second portion 310, which contains inner code parity data encoded by an inner code. This inner code parity 310 provides inner code protection against errors in the segment to which it belongs. More specifically, inner code parity 310 can provide protection against errors in the inner code data 308.

Each of the r number of segments 306 includes a first portion 312, which contains parity data encoded by the outer code. Each of the r number of segments 306 also includes a second portion 314, which contains inner code parity data encoded by the inner code. The outer code parity 312 provides outer code protection against inner code failures, while the inner code parity 314 of r number of segments 306 provides inner code protection against errors in the segment to which it belongs. More specifically, the inner code parity 314 provides protection against errors in the outer code parity 312. Therefore, each row of segments is considered to be an inner code word 316 starting with inner code word 0 and ending with inner code word k+r−1.

Any number of segments 306 (as represented by rows) can be provided for the outer code. The more segments that are provided for the outer code, the more errors that can be detected and corrected by the outer code parity 312. However, increasing the number of segments for the outer code and thereby increasing the number of parity data symbols, comes at the cost of reduced storage capacity of user data. As illustrated in FIG. 3 and for example, if the k number of segments is equal to 20 and the r number of segments is equal to 10, the outer code parity 312 is capable of correcting a total of 10 errors in the 30 total segments which could be affected. It should be realized that errors can occur both in segments 304 as well as in segments 306.

In one embodiment, each of the plurality of segments 302 indicated by a row in FIG. 3 is associated with a logical block address (LBA). Each LBA designates an address for the row of inner code data and inner code parity on a storage medium. In embodiments in which a magnetic disc provides the storage medium, the LBA can be the LBA of a data sector of a data track on the storage medium.

Figure 4:
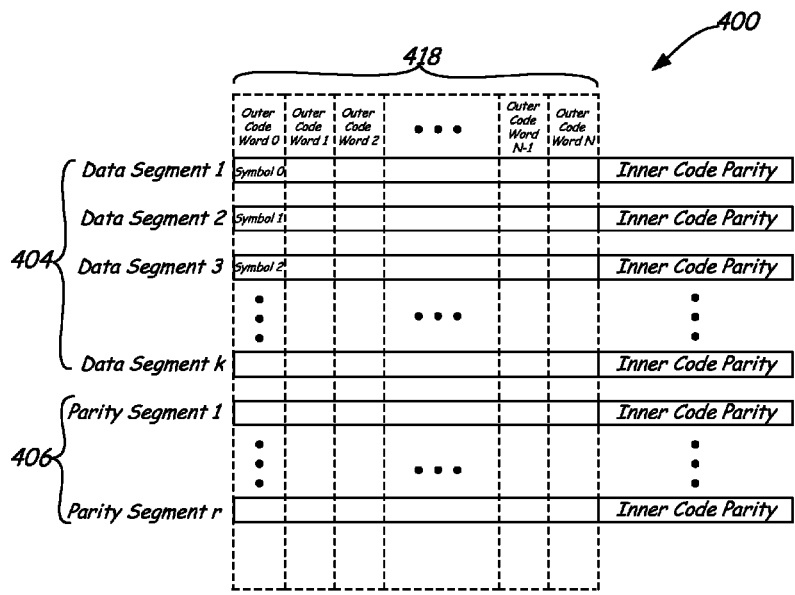
FIG. 4 illustrates a diagrammatic view of another embodiment of a data unit and its organized groupings of data into inner and outer codes based on a Reed-Solomon scheme.

FIG. 4 illustrates a diagrammatic view of one embodiment of a data unit 400 and its organized groupings of data into inner and outer codes based on a Reed-Solomon (RS) scheme. With a RS outer code, the unit of correction is a symbol. A symbol contains multiple bits of data. More specifically, the r number of segments 406 are associated with the k number of segments 404 to derive a plurality of symbol-based outer code words 418. Each outer code word 418 contains m number of symbols from each segment for correcting m number of symbols in each outer code word 418, wherein m is an integer greater than or equal to 1. For purposes of simplification, FIG. 4 illustrates Reed-Solomon outer code words 418 having one symbol per segment (i.e., m=1).

Using the RS outer code illustrated in FIG. 4, it is possible, in some instances, for more than the r number of inner code failures to be corrected. Even if inner code words are not recoverable, most of the bits of the inner code words are correct. Similarly, symbols in outer code words that are contained in failing inner code words will be mostly error-free and many outer code words can be corrected. More specifically, an outer code having r number of segments 406 can correct r number of inner code failures using erasures, where an erasure is referred to as knowing the location of a symbol. However, the outer code can correct many outer code words 418 without using erasures.

Figure 5:
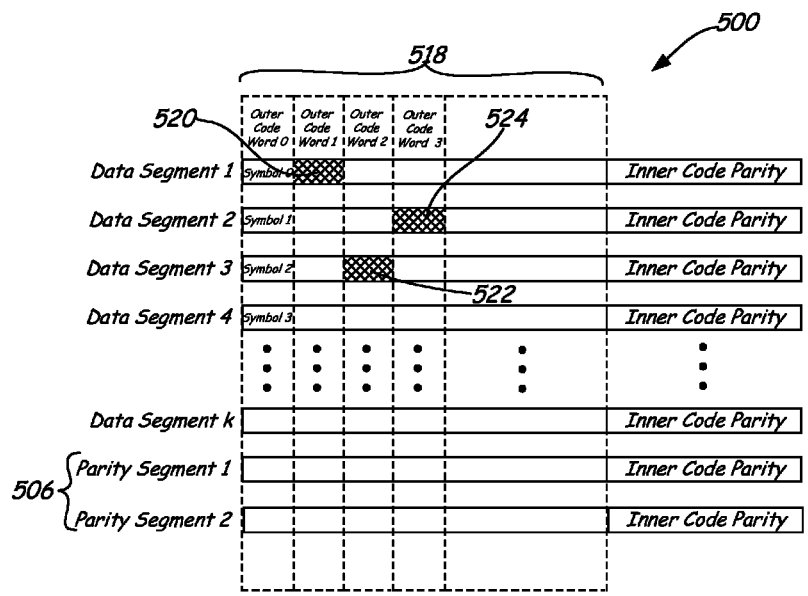
FIG. 5 illustrates a diagrammatic view of yet another embodiment of a data unit and its organized groupings of data into inner and outer codes based on a Reed-Solomon scheme.

FIG. 5 illustrates a diagrammatic view of one embodiment of a data unit 500 and its organized groupings of data into inner and outer codes based on a RS scheme. In FIG. 5, the r number of segments 506 is two (i.e., r=2). For simplicity and as illustrated in FIG. 4, each outer code word 518 contains one symbol per segment (i.e., m=1). In addition, data unit 500 includes three symbol errors 520, 522 and 524 as illustrated in cross-hatch. These three symbol errors are representative of errors that exceed the correction capability of the inner code.

Because data unit 500 includes three inner code failures and data unit 500 includes only two parity segments, the RS outer code cannot correct the three inner code failures using erasures. However, each outer code can correct one symbol in error in an outer code word 518 without erasures, and therefore the three errors shown can be corrected and the corresponding three inner code words can be recovered. It should be realized though that with higher bit error rates, the probability of having two or more symbol errors in the same outer code word in the configuration illustrated in FIG. 5 is significant and would limit this functionality.

Figure 6:
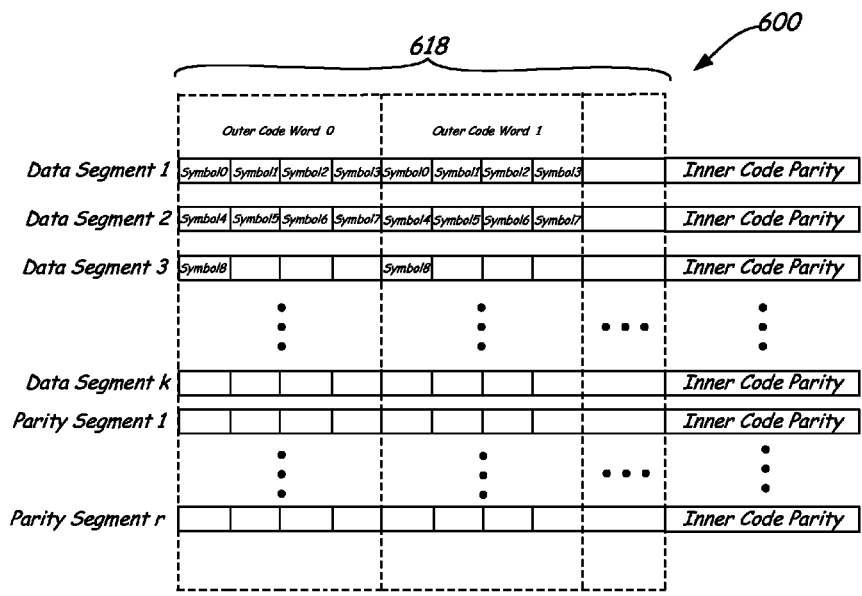
FIG. 6 illustrates a diagrammatic view of yet another embodiment of a data unit and its organized groupings of data into inner and outer codes based on a Reed-Solomon scheme.

FIG. 6 illustrates a diagrammatic view of one embodiment of a data unit 600 and its organized groups of data into inner and outer codes based on a RS scheme. As illustrated in FIG. 6, longer outer code words 618 are used compared to the length of outer code words in FIG. 5. These longer outer code words 618 contain four symbols in each inner code word (i.e., m=4). In a system without erasures, more errors can be corrected using a longer outer code word than that of a short outer code word.

Figure 7:
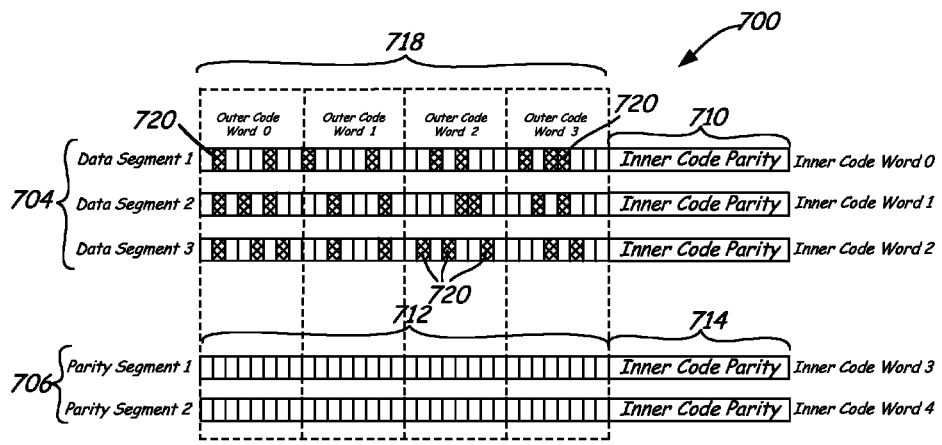
FIG. 7 illustrates a diagrammatic view of yet another embodiment of a data unit and its organized groupings of data into inner and outer codes based on a Reed-Solomon scheme.

FIG. 7 illustrates a diagrammatic view of one embodiment of a data unit 700 and its organized groups of data into inner code 710 and 714 and outer code 712 based on a RS scheme. In FIG. 7, each outer code word 718 includes even longer outer code words. In particular, each outer code word 718 include eight symbols (i.e., m=8) per segment 704 and 706. With two r segments (i.e., r=2) and each outer code word including eight symbols per r segment 706, sixteen symbols of parity in each outer code word 718 can correct eight symbol errors (not correctable by the inner code) without erasure. Therefore, in the embodiment illustrated in FIG. 7, all of the outer code words 718 are correctable since each outer code word 718 has at most eight symbol errors 720 as represented in cross-hatch. Although no symbol errors exist in segments 706, for purposes of simplification, it should be realized that segments 706 can also include symbol errors which would also have to be corrected in order to utilize outer code 712.

If, on the other hand, any of the outer code words 718 had more than eight symbol errors 720, then the outer code 712 illustrated in FIG. 7 cannot recover all of the errors that could not be corrected by the inner code. Any outer code words 718 that include a number of symbol errors that exceeds the correction capability of the outer code are not correctable and therefore not recoverable. However, in one embodiment, the capability of the outer code to correct inner code failures can be further extended. In particular, the capability of the outer code to correct more symbol errors can be extended by iterating between the inner and the outer codes. The corrected data from the outer code words that are correctable can be used to recover some of the inner code words that had original failed. Correcting only a fraction of the bits in error at a time can be sufficient to gradually reduce the number of errors by repeated iterations until all the errors are corrected. In the other words, only some of the outer code words are corrected in the first iteration, compared to correcting all of the outer code words.

Figure 9:
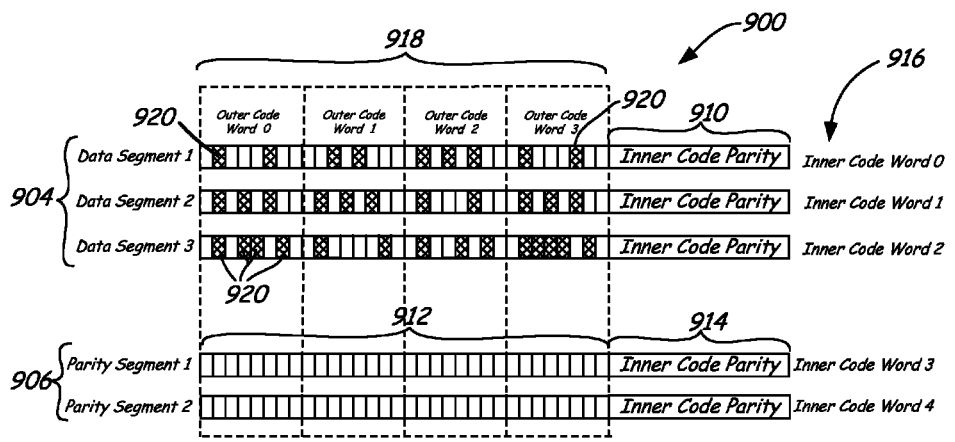
FIG. 9 illustrates a diagrammatic view of yet another embodiment of a data unit and its organized groupings of data into inner and outer codes based on a Reed-Solomon scheme.
Figure 8:
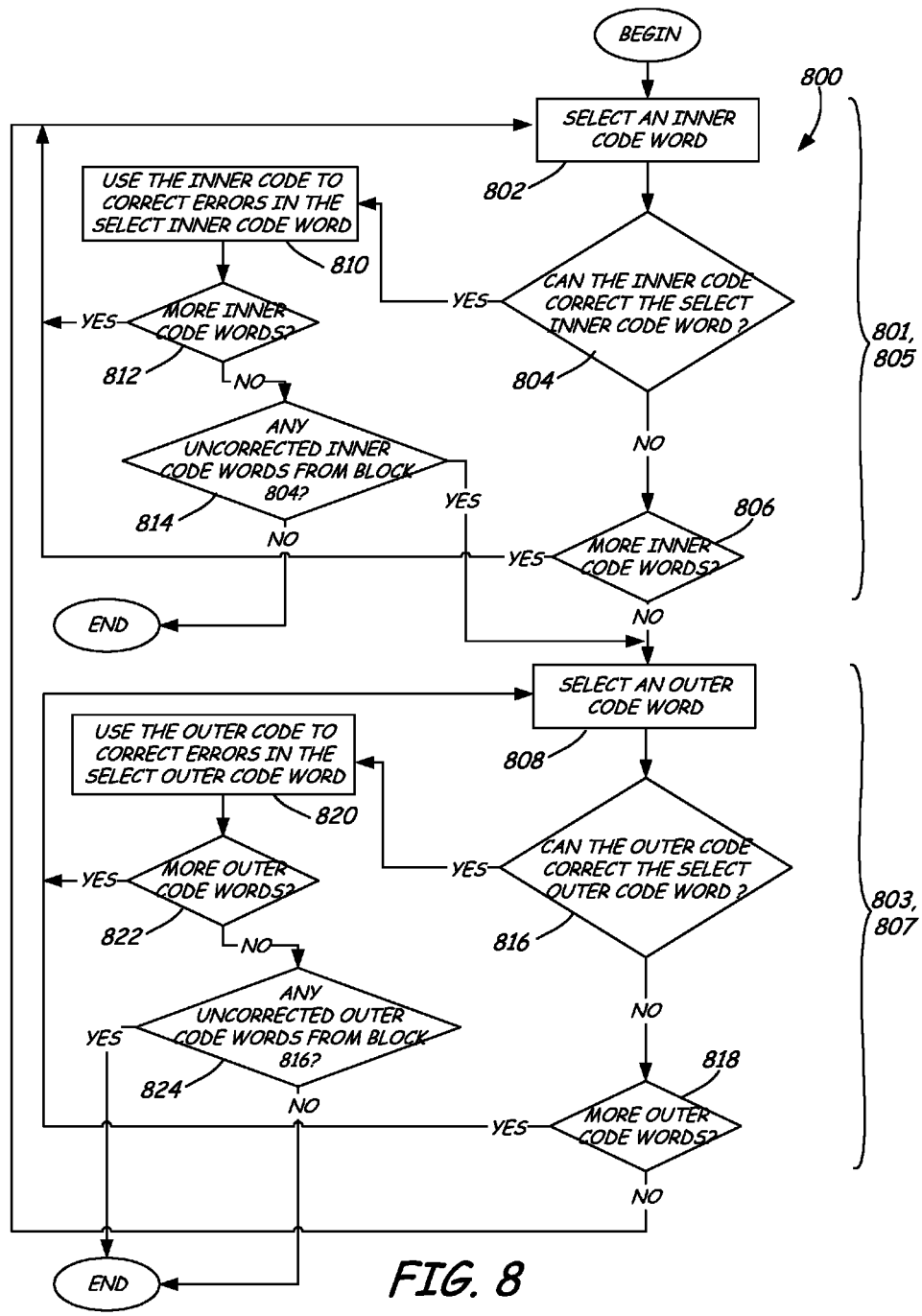
FIG. 8 is a flowchart illustrating a method of recovering data using inner and outer codes under one embodiment.

FIG. 8 illustrates a method 800 of recovering data on a storage medium under one embodiment. More specifically, method 800 recovers data on a storage medium by iterating between using the inner code and the outer code to correct errors. With reference to FIG. 9, which illustrates a diagrammatic view of one embodiment of a data unit 900 and its organized groups of data into inner code 910 and 914 and outer code 912 based on a RS scheme, each outer code word 918 can correct eight symbols of error. More specifically, each outer code word 918 includes eight symbols (i.e., m=8) per segment 904 and 906. With two r segments (i.e., r=2) and each outer code word including eight symbols per parity segment 906, sixteen symbols of parity in each outer code word 918 can correct eight symbol errors (not correctable by the inner code) without erasure. Although no symbol errors exist in segments 906, for purposes of simplification, it should be realized that parity segments 906 can include symbol errors which would also have to be corrected in order to utilize outer code 912.

Given the correction capability discussed above, exemplary data unit 900 cannot recover all of the symbol errors using the inner code on its own or by using the outer code on its own. For example, the amount of symbol errors in each inner code word 916 exceeds the correction capability or correction reliability of inner code 910 and is unable to recover these inner code words. Furthermore, outer code word 0 includes nine symbol errors 920 and outer code word 3 includes ten symbol errors 920. Therefore, the amount of symbol errors in these outer code words 918 exceeds the correction capability of outer code 912 and is unable to recover these outer code words. However, the symbol errors in the exemplary embodiment illustrated in FIG. 9 can be corrected by iterating between using inner code 910 and outer code 912.

With reference back to block 802 of FIG. 8, an inner code word 916 is selected. At block 804, it is determined whether the inner code can correct the select inner code word. In FIG. 9, the inner code fails to correct the symbol errors 920 in each of inner code words 0, 1 and 2. Therefore, when each of these three inner code words 916 are selected, the method would pass to block 806 to determine if more inner code words 916 need to be selected for analysis. If all inner code words 916 have been selected for analysis, then the method passes to block 808. If, however, not all inner code words 916 have been selected for analysis, then the method passes back to block 802. In the exemplary embodiment of FIG. 9, such would be the case because inner code words 3 and 4 have yet to be analyzed. In FIG. 9, in the inner code can correct errors in inner code words 3 and 4. Therefore, when each of these two inner codes words 916 are selected, the method would pass to block 810. At block 810, the inner code 910 or 914 (914 in the case of inner code words 3 and 4) corrects any errors in the select inner code word. While neither inner code word 3 nor 4 include symbol errors, if there were errors correctable by the inner code 914, these errors would be corrected at block 810.

At block 812, the method 800 determines if more inner code words 916 need to be selected for analysis. If all inner code words have been selected for analysis, then the method 800 passes to block 814. If not all inner code words have been selected for analysis, the method passes back to block 802. At block 814, it is determined whether there are any uncorrected inner code words 916 from block 804. If so, method 800 passes to block 808. If not, all inner code words 916 are corrected and the method ends. As illustrated in FIG. 8, the above discussion in regards to blocks 802, 804, 806, 810, 812 and 814 complete a first iteration 801 of the use of inner code to correct symbol errors in a data unit.

In conjunction with the exemplary embodiment illustration in FIG. 9, inner code words 0, 1 and 2 remain uncorrected. Therefore, method 800 passes to block 808 where an outer code word 918 is selected. At block 816, it is determined whether the outer code can correct the select outer code word. In FIG. 9, the symbol errors 920 in each of outer code words 0 and 3 exceed the correction capability of outer code 912 (i.e., each of outer code words 0 and 3 include more than eight symbol errors). Therefore, when each of these two outer code words 918 are selected, the method would pass to block 818 to determine if more outer code words 918 need to be selected for analysis. If all outer code words 918 have been selected for analysis, then the method passes back to block 802. If, however, not all outer code words 918 have been selected for analysis, then the method passes back to block 808. In the exemplary embodiment of FIG. 9, such would be the case because outer code words 1 and 2 have yet to be analyzed. In FIG. 9, the amount of symbol errors in outer code words 1 and 2 do not exceed the correction capability of the outer code. In particular and as previously discussed, outer code words 1 and 2 include 7 and 8 symbol errors. Therefore, when each of these two outer codes words 918 are selected for analysis, the method would pass to block 820. At block 820, the outer code 912 can correct the symbol errors in outer code words 1 and 2.

At block 822, the method 800 determines if more outer code words 918 need to be selected for analysis. If all outer code words have been selected for analysis, then the method 800 passes to block 824. If not all outer code words have been selected for analysis, the method passes back to block 808 to select those outer code words. At block 824, it is determined whether there were any uncorrected outer code words 918 as determined from block 816. If so, method 800 passes back to block 802 to perform a second iteration 805 of error correction using the inner code. If not, all outer code words 916 are corrected and the method ends. An indication that all outer code words 918 are corrected is also an indication that all inner code words 916 are corrected. As illustrated in FIG. 8, the above discussion in regards to blocks 808, 816, 818, 820, 822 and 824 complete a first iteration 803 of the use of outer code to correct symbol errors in a data unit.

Figure 10:
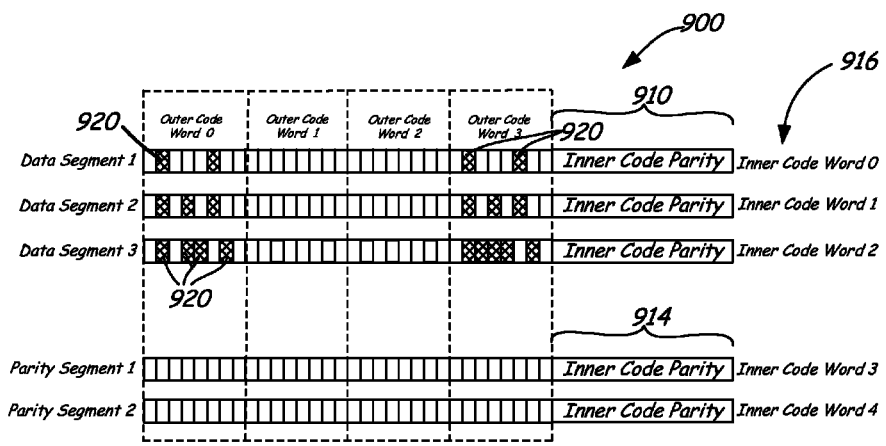
FIG. 10 illustrates a diagrammatic view of the data unit illustrated in FIG. 9 after data is recovered using a first iteration of inner code and a first iteration of outer code.

FIG. 10 illustrates a diagrammatic view of data unit 900 and its organized groups of data after performing the first iteration 801 of inner code and the first iteration of 803 on the data unit. In FIG. 10, outer code words 1 and 2 are corrected, which leaves outer codes 0 and 3 uncorrected.

With more outer code word symbol errors to correct, method 800 is passed back to block 802 to begin performing a second iteration 805 of inner code. At block 802, an inner code word 916 is selected. At block 804, it is determined whether the inner code can correct the select inner code word. In FIG. 10, only the symbol errors 920 cannot be corrected by inner code 910. Therefore, when inner code words 2 is selected, the method would pass to block 806 to determine if more inner code words 916 need to be selected for analysis. If all inner code words 916 have been selected for analysis, then the method passes to block 808. If, however, not all inner code words 916 have been selected for analysis, then the method passes back to block 802. In the exemplary embodiment illustrated in FIG. 10, such would be the case because inner code words 0, 1, 3 and 4 have yet to be analyzed. In FIG. 10, the symbol errors in inner code words 0, 1, 3 and 4 can be corrected by the inner code. Therefore, when each of these four inner codes words 916 are selected, the method would pass to block 810. At block 810, the inner code 910 or 914 (910 in the case of inner code words 0 and 1 and 914 in the case of inner code words 3 and 4) corrects errors in the select inner code word. While neither inner code word 3 nor 4 include symbol errors, if there were errors correctable by the inner code 914, these errors would be corrected at block 810.

At block 812, the method 800 determines if more inner code words 916 need to be selected for analysis. If all inner code words have been selected for analysis, then the method 800 passes to block 814. If not all inner code words have been selected for analysis, the method passes back to block 802. At block 814, it is determined whether there are any uncorrected inner code words 916 from block 804. If so, method 800 passes to block 808. If not, all inner code words 916 are corrected and the method ends.

Figure 11:
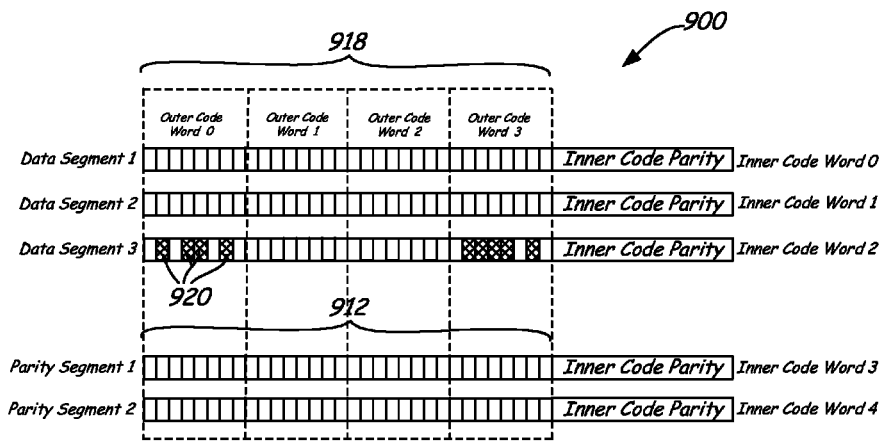
FIG. 11 illustrates a diagrammatic view of the data unit illustrated in FIG. 9 after data is recovered using a second iteration of inner code.

In conjunction with the exemplary illustration in FIG. 11, only inner code word 2 remains uncorrected. Therefore, method 800 passes to block 808 to perform a second iteration 807 of the use of outer code to correct symbol errors in a data unit. At block 808, an outer code word 918 is selected. At block 816, it is determined whether the outer code can correct the select outer code word. In FIG. 11, if any of outer code words 918 exceed the correction capability of outer code 912 (i.e., each of outer code words 918 include more than eight symbol errors), then the method would pass to block 818 to determine if more outer code words 918 need to be selected for analysis. If all outer code words 918 have been selected for analysis, then the method passes back to block 802. If, however, not all outer code words 918 have been selected for analysis, then the method passes back to block 808. In FIG. 9, the amount of symbol errors in outer code words 0, 1, 2 and 3 do not exceed the correction capability of the outer code. In particular, outer code word 0 includes only four symbol errors, outer code word 1 includes no symbol errors, outer code word 2 includes no symbol errors and outer code word 3 includes only five symbol errors. Therefore, when each of these outer codes words 918 are selected for analysis, the method would pass to block 820. At block 820, the outer code 912 can correct the symbol errors in all outer code words.

Figure 12:
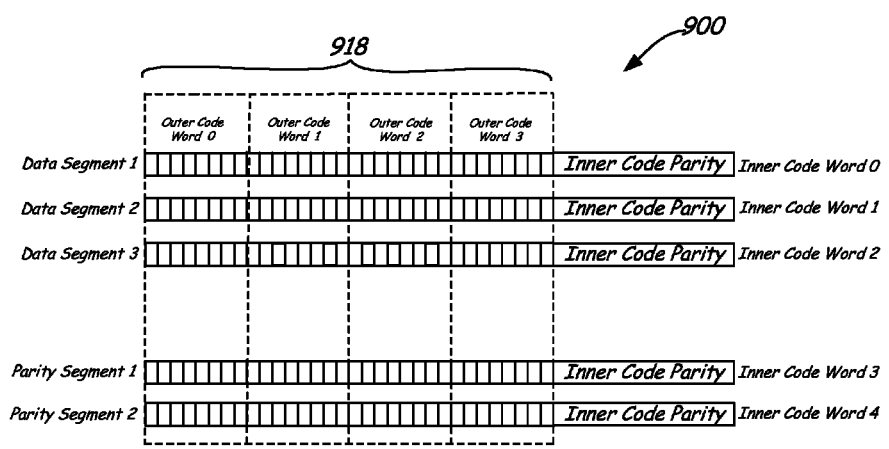
FIG. 12 illustrates a diagrammatic view of the data unit illustrated in FIG. 9 after data is recovered using a second iteration of outer code.

At block 822, the method 800 determines if more outer code words 918 need to be selected for analysis. If all outer code words have been selected for analysis, then the method 800 passes to block 824. If not all outer code words have been selected for analysis, the method passes back to block 808 to select those outer code words. At block 824, it is determined whether there were any uncorrected outer code words 918 as determined from block 816. If so, method 800 passes back to block 802 to perform a third iteration of error correction using the inner code. If not, all outer code words 918 are corrected and the method ends. As illustrated in FIG. 12, all outer code words 918 of data unit 900 have been corrected using first and second iterations of inner and outer code and therefore method 800 ends It is to be understood that even though numerous characteristics and advantages of various embodiments have been set forth in the foregoing description, together with details of the structure and function of various embodiments of the invention, this disclosure is illustrative only, and changes may be made in detail, especially in matters of structure and arrangement of parts within the principles of the disclosure to the full extent indicated by the broad general meaning of the terms in which the appended claims are expressed. For example, the particular elements may vary depending on the particular type of data storage device while maintaining substantially the same functionality without departing from the scope and spirit of the present invention.

In addition, embodiments described herein can be directed to a data storage device for disc media, however, it will be appreciated by those skilled in the art that the teachings of the present invention can be applied to other types of data storage devices, without departing from the scope and spirit of the present invention.

What is claimed is:

1. A method comprising:
   performing a first iteration of an inner code word error correction process including:
      determining if an inner code can correct errors in a first selected inner code word of multiple inner code words;
      when the inner code can correct the first selected inner code word, performing an inner code error correction on the first selected inner code word;
      repeating the inner code word error correction process for another selected inner code word of the multiple inner code words;
   performing a first iteration of an outer code word error correction process when there are uncorrected inner code words, including:
      determining if an outer code can correct errors in a first selected outer code word of multiple outer code words wherein each symbol included in one of the inner code words is also included in one of the outer code words;
      when the outer code can correct the first selected outer code word, performing an outer code error correction on the first selected outer code;
      repeating the outer code word error correction process for another selected outer code word of the multiple outer code words; and
   performing a second iteration of the inner code word error correction process when there are uncorrected outer code words.

2. The method of claim 1, wherein performing the first iteration of inner code error correction process comprises:
   selecting inner code words to determine selected inner code words; and
   determining whether errors in the selected inner code words can be corrected by the inner code.

3. The method of claim 2, wherein if the errors in at least one of the selected inner code words fails to be corrected by the inner code, then perform the first iteration of the outer code word error correction process.

4. The method of claim 1, wherein performing the first iteration of the outer code word error correction process comprises:
   selecting outer code words to determine selected outer code words; and
   determining whether errors in the selected outer code words can be corrected by the outer code.

5. The method of 4, wherein if the errors in at least one of the selected outer code words fails to be corrected by the outer code, then perform the second iteration of the inner code word error correction process.

6. The method of claim 1, wherein performing the second iteration of the inner code word error correction process comprises:
   selecting inner code words to determine selected inner code words; and
   determining whether errors in the selected inner code words can be corrected by the inner code.

7. The method of claim 6, wherein if the errors in at least one of the selected inner code words fails to be corrected by the inner code, then perform a second iteration of the outer code word error correction process.

8. The method of claim 1, further comprising performing a second iteration of the outer code word error correction process if errors in at least one inner code word fails to be corrected by the inner code word correction process after the second iteration of the inner code word error correction process.

9. The method of claim 1, further comprising when the inner code cannot correct errors in the first selected inner code word, then initiating the outer code word error correction process without performing an inner code error correction on the first selected inner code word.

10. The method of claim 1, further comprising when the outer code cannot correct errors in the first selected outer code word, then initiating the inner code word error correction process without performing an outer code error correction on the first selected outer code.

11. An apparatus comprising:
    a data storage medium including at least one data unit defining a plurality of symbol-based inner code words and a plurality of symbol-based outer code words, wherein each symbol included in one of the inner code words is also included in one of the outer code words;
    a processor configured to perform a data recovery process including:
       determine if an inner code can correct errors in a selected inner code word of the plurality of symbol-based inner code words;
       when the inner code can correct the selected inner code word, perform inner code error correction on the selected inner code word;
       when the inner code cannot correct all errors in the plurality of symbol-based inner code words, determine if an outer code can correct errors in a selected outer code word of the plurality of symbol-based outer code words;
       when the outer code can correct the selected outer code word, perform outer code error correction on the selected outer code word; and
       when the outer code cannot correct all errors in the plurality of symbol-based outer code words, repeat the data recovery process.

12. The apparatus of claim 11, wherein each data unit in the storage medium further comprises a plurality of segments for storing data, the plurality of segments including k number of segments and r number of segments, each of the k and r number of segments being one of the inner code words and including inner code parity for providing inner code protection against errors within the inner code word, each of the r number of segments including outer code parity for providing outer code protection against inner code failures.

13. The apparatus of claim 11, further comprising the processor is configured to:
- select inner code words to produce selected inner code words;
- determine whether errors in the selected inner code words can be corrected by the inner code; and
- when errors in at least one of the selected inner code words fails to be corrected by the inner code, then the processor performs the outer code error correction.

14. The apparatus of claim 11, further comprising the processor is configured to:
- select outer code words to produce selected outer code words;
- determine whether errors in the selected outer code words can be corrected by the outer code; and
- when errors in at least one of the selected outer code words fails to be corrected by the outer code, then the processor performs the inner code error correction.

15. The apparatus of claim 11, wherein the data storage medium comprises a shingled magnetic recording medium.

16. The apparatus of claim 11, further comprising the data recovery process including: when the inner code cannot correct errors in the selected inner code word, then proceeding to determining if an outer code can correct errors in the selected outer code word of the plurality of outer code words without performing inner code error correction on the selected inner code word.

17. The apparatus of claim 11, further comprising the data recovery process including: when the outer code cannot correct errors in the selected outer code word, then proceeding to determining if the inner code can correct errors in the selected inner code word of the plurality of inner code words without performing outer code error correction on the selected outer code word.

18. A method comprising:
- performing a data recovery process on data from a data storage medium including at least one data unit having a plurality of segments for storing data, the plurality of segments including k number of segments and r number of segments, each k and r segment including an inner code parity for providing inner code protection against errors within the segment and each r segment including outer code parity for providing outer code protection against inner code failures;
- associating the r number of segments with the k number of segments to derive a plurality of outer code words, wherein each outer code word contains m number of symbols from each segment for correcting m number of symbols in each outer code word;
- iteratively performing an error correction process by:
  - determining if an inner code can correct errors in a first selected inner code word of the plurality of inner code words;
  - when the inner code can correct errors in the first selected inner code word, then performing inner code error correction on the plurality of inner code words;
  - when an error in at least one of the plurality of inner code words fails to be corrected by the inner code, then determining if an outer code can correct errors in a first selected outer code word of the plurality of outer code words;
  - when the outer code can correct errors in the first selected outer code word, then performing outer code error correction on the plurality of outer code words; and
  - when an error in at least one of the plurality of outer code words fails to be corrected by the outer code, then repeating the error correction process;
- wherein k, r and m are integers greater than or equal to 1.

19. The method of claim 18, further comprising the error correction process including when the inner code cannot correct errors in the first selected inner code word, then proceeding to determining if an outer code can correct errors in a first selected outer code word of the plurality of outer code words without performing inner code error correction on the plurality of inner code words.

20. The method of claim 19, further comprising the error correction process including when the outer code cannot correct errors in the first selected outer code word, then proceeding to determining if an inner code can correct errors in a first selected inner code word of the plurality of inner code words without performing outer code error correction on the plurality of outer code words.

* * * * *